(12) United States Patent
Grosse et al.

(10) Patent No.: US 8,530,855 B2
(45) Date of Patent: Sep. 10, 2013

(54) METHOD FOR PRODUCING A MICRO-GRIPPER

(75) Inventors: Christian Grosse, Kollau (DE); Frank Altmann, Halle (DE); Michél Simon, Reichardtswerben (DE); Hilmar Hoffmeister, Aalen (DE); Detlef Riemer, Markkleeberg (DE)

(73) Assignees: Fraunhofer-Gesellschaft zur Förderung der Angewandten Forschung E.V., Munich (DE); Carl Zeiss Microscopy GmbH, Jena (DE)

( * ) Notice: Subject to any disclaimer, the term of this patent is extended or adjusted under 35 U.S.C. 154(b) by 882 days.

(21) Appl. No.: 12/301,641

(22) PCT Filed: Mar. 9, 2007

(86) PCT No.: PCT/EP2007/002109
§ 371 (c)(1),
(2), (4) Date: Jun. 18, 2009

(87) PCT Pub. No.: WO2007/134660
PCT Pub. Date: Nov. 29, 2007

(65) Prior Publication Data
US 2010/0032581 A1    Feb. 11, 2010

(30) Foreign Application Priority Data

May 20, 2006  (DE) .................. 10 2006 023 768

(51) Int. Cl.
*B66C 1/42* (2006.01)
*G21K 5/08* (2006.01)

(52) U.S. Cl.
USPC ................ 250/440.11; 250/442.11; 294/86.4

(58) Field of Classification Search
USPC ...... 250/440.11, 442.11; 294/86.4; 427/331; 216/37; 204/192.32; 977/962
See application file for complete search history.

(56) References Cited

U.S. PATENT DOCUMENTS

| 5,149,673 A | 9/1992 | MacDonald et al. |
| 7,220,500 B1 * | 5/2007 | Tomiyasu et al. ............. 428/831 |
| 7,849,515 B2 * | 12/2010 | Hashiguchi et al. ............ 850/18 |

(Continued)

FOREIGN PATENT DOCUMENTS

| DE | 195 22 004 A1 | 1/1997 |
| DE | 195 23 229 A1 | 1/1997 |

(Continued)

OTHER PUBLICATIONS

Caesar: "Annual Report 2003" [Online], Sep. 7, 2004, XP002444970, Gefunden im Internet: URL:http://web.archive.org/web/20040907012914/http://www.caesar.de/uploads/media/AR_03_screen_finalVersion.pdf.

*Primary Examiner* — David A Vanore
*Assistant Examiner* — Brooke Purinton
(74) *Attorney, Agent, or Firm* — Antonelli, Terry, Stout & Kraus, LLP.

(57) ABSTRACT

A method is described for producing a micro-gripper, which comprises a base body and a gripping body connected integrally to the base body, which projects beyond the base body and provides a receptacle slot on a free end area in such a way that a micrometer-scale or sub-micrometer-scale object may be clamped in the receptacle slot for gripping and holding, as well as a micro-gripper according to the species.

25 Claims, 8 Drawing Sheets

(56) References Cited

U.S. PATENT DOCUMENTS

| | | |
|---|---|---|
| 2002/0061662 A1 | 5/2002 | Boggild |
| 2002/0166976 A1 | 11/2002 | Sugaya et al. |
| 2003/0153169 A1* | 8/2003 | Wang et al. .................. 438/586 |
| 2003/0153198 A1* | 8/2003 | Conti et al. .................. 438/761 |
| 2003/0178139 A1* | 9/2003 | Clouser et al. ............... 156/330 |
| 2004/0004363 A1 | 1/2004 | Drewery |
| 2005/0029827 A1 | 2/2005 | Hashiguchi et al. |
| 2006/0014196 A1* | 1/2006 | Konno et al. .................... 435/6 |
| 2006/0037932 A1 | 2/2006 | Lammel et al. |
| 2006/0220403 A1* | 10/2006 | Shin et al. .................... 294/86.4 |

FOREIGN PATENT DOCUMENTS

| | | |
|---|---|---|
| DE | 196 48 165 A1 | 4/1997 |
| DE | 197 15 083 A1 | 8/1997 |
| DE | 101 14 551 C1 | 10/2002 |
| DE | 102 44 785 A1 | 4/2004 |

* cited by examiner

Schnitt A-A

Figure 7b (Detail)
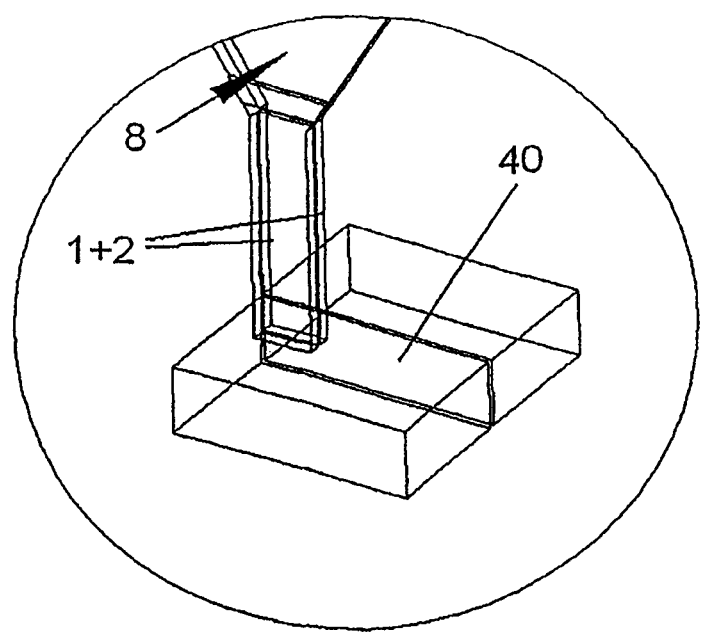
Figure 8
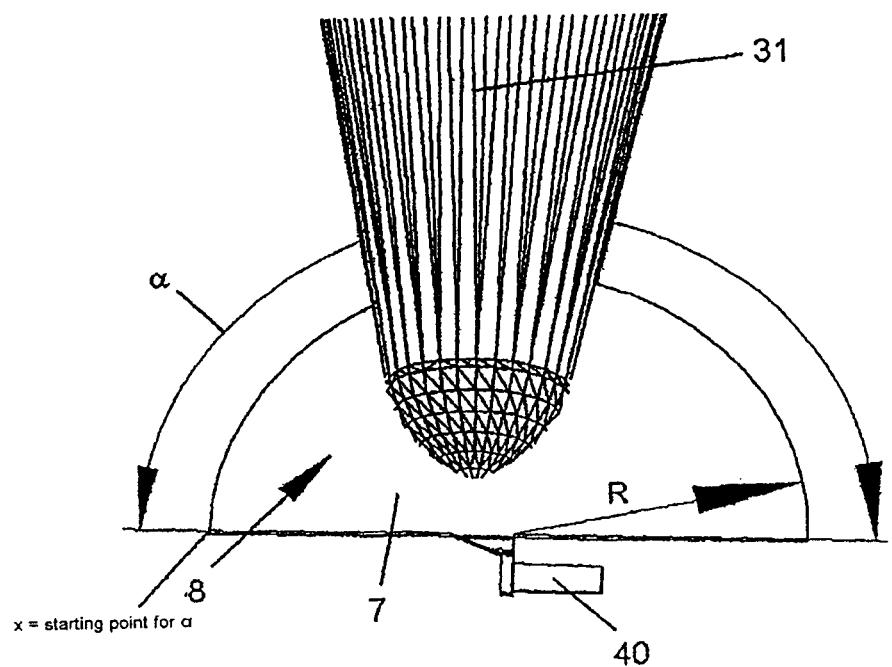

METHOD FOR PRODUCING A MICRO-GRIPPER

CROSS REFERENCE TO RELATED APPLICATION

This application claims the benefit of PCT/EP2007/002109, filed Mar. 9, 2007, which application is incorporated herein by reference in its entirety.

BACKGROUND OF THE INVENTION

1. Field of the Invention

The invention relates to a micro-gripper for accommodating and holding micrometer-scale or sub-micrometer-scale objects and to a method for the production thereof.

2. Description of the Prior Art

Micro-grippers are currently used in numerous fields in the context of microsystem technology. Thus, micro-grippers are used, for example, in microtechnology and nanotechnology for manipulation and mounting or for joining extremely small objects. Further areas of application for micro-grippers are found in physics, biology, chemistry, and medicine, micro-grippers being used, for example, in the context of the analysis and assaying of samples for accommodating, gripping, and holding the samples.

The micro-grippers typically comprise a base body, which is connected to two or more movable and/or elastic gripping elements, which are used to accommodate and hold an object. At least one actuator provided on the micro-gripper is typically provided for the active actuation of the gripping elements, which moves the gripping elements, which act toward one another. In micro-grippers of this type, the gripping forces acting on the object may be partially set or regulated by a corresponding activation of the actuators. Micro-grippers without actuators are also known, in which the accommodation and holding of an object does not occur actively, but rather passively with exploitation of elastic material properties. Micro-grippers of this type have at least two opposing gripping elements spaced apart from one another, between which an object may be clamped. The gripping elements are elastically deformed by the clamping of an object between them, and thus generate elastic retention forces reacting onto the object.

It is to be noted here that for the following statements, the term micro-gripper is restricted to the versions having only two gripping elements.

Thus, an embodiment of a micro-gripper for micro-mounting is disclosed in the publication DE 195 23 229 A1, which comprises a base body, a piezotranslator fastened to the base body as a linear actuator, and a microstructure body connected to the base body and the piezotranslator. Two opposing gripping elements acting toward one another and a mechanical lever transmission having bending joints for the enlarging transmission of a linear movement of the piezotranslator onto the gripping elements are constructively unified in one component in the microstructure body. Upon a length change of the piezotranslator, the elastic bending elements deform and thus initiate a targeted movement of the gripping elements away from or toward one another.

The production of the microstructure body is performed from a (100) silicon wafer polished on both sides having a thickness of 240 μm using the known structuring processes, lithography, and anisotropic etching. The microstructure body is subsequently fastened on the base body, a silicon substrate, using adhesive in such a way that only selected small contact areas between the microstructure body and the base body are glued, the bending elements and the gripping elements being axially displaceable along the contact faces. The production of the microstructure body from silicon, especially its good ability to be micro-structured and the lack of plastic deformation of silicon, is especially emphasized as the essential advantage of the described micro-gripper. In addition, the possibility exists of attaching piezoelectric, for example, piezoresistive layers to the gripping elements, in particular to their particular gripping faces, to convert the gripping force into an electrical signal and thus to adapt the gripping force to the object to be gripped. Further embodiments of micro-grippers which use piezosystems as actuators may be inferred, for example, from the publications DE 196 48 165 A1 and DE 101 14 551 C1.

In addition to piezo systems, other elements or principles are also used to move the gripping elements. Thus, a micro-gripper may be inferred from the publication DE 197 15 083 A1, in which flat coils or permanent magnets of an electromagnetic drive are integrated in a yielding gripping mechanism. The closing of the gripping elements is caused by applying an external magnetic field. The publications US 2004/0004364 A1, US 2002/0061662 A1, and U.S. Pat. No. 5,149,673 A, in contrast, describe micro-grippers whose gripping elements may be moved using electrostatic attractive or repulsive forces. Finally, a nanogripper is disclosed in the publication US 2005/0029827 A1, in which the gripping elements may be moved by exploiting electro-thermal material properties. The gripping elements are connected via a jointed mechanism to elements which heat as a result of a current flux, expand, and cause a movement of the gripping elements via the jointed mechanism.

The grippers cited up to this point all have the disadvantage that it is necessary to feed electrical or magnetic energy to the actuator to grip and hold objects. If this is interrupted or disturbed, a failure of the gripper occurs, that is, the object may detach from the micro-gripper in an undesired way. In addition, the necessary electrical adaptation of the micro-gripper in the required dimensions in the micrometer range is complex and costly.

In particular, any contamination of the sample by the micro-gripper, for example, by a material transfer from a preceding sample to the next sample, is to be prevented for applications of micro-grippers in the scope of material analysis of micrometer-scale or sub-micrometer-scale samples. Therefore, for example, to grip and hold samples in the context of study, in particular using electron microscopes, such as transmission electron microscopes (TEM) or scanning electron microscopes (SEM), new micro-grippers are used for each sample. Because micro-grippers are only intended for a single use for purposes of this type, they are to be producible cost-effectively as mass produced products. Nonetheless, they must fulfill all the requirements to ensure reliable gripping and holding in such applications. The micro-grippers described above are not or are not optimally suitable for this purpose for the cited reasons, however.

In addition to the micro-grippers having actuators described above, a micro-gripper is described in the publication US 2002/0166976 A1, which is particularly also suitable for use for gripping and holding a sample in the context of studies using TEM. The micro-gripper described therein comprises a rod-shaped or cylindrical elongate body, which has one or more receptacle slots open on three sides on one end in such a way that a sample may be clamped in the receptacle slot. The accommodation and holding of the sample is based, as described above, on the elastic deformation of the material surrounding the receptacle slot and the restoring force thus caused, which acts on the clamped sample.

The following method may be inferred from the cited document for producing the micro-ripper. A piece of linear tungsten wire having a wire diameter of 50 μm is used as the starting material. In a first method step, an end area of the tungsten wire is initially processed using electropolishing or an etching method in such a way that the tungsten wire tapers in this end area toward the wire end to a diameter of a few micrometers. In a second work step, a receptacle slot open on three sides toward the end of the tapered area is worked out of the now conically tapering end area of the tungsten wire using an ion beam incident perpendicularly to the longitudinal axis of the tungsten wire. In a third method step, in addition to the first receptacle slot, for example, a second receptacle slot rotated by 90° thereto may be worked out by a further application of the ion beam. At least two or four gripping elements, between which an object may be clamped, thus arise in the tapered end area of the tungsten wire. The receptacle slot has a width of 2 μm and a depth of 30 μm according to one exemplary embodiment.

The micro-gripper disclosed in US 2002/0166976A1 has the disadvantage that it is not technically possible by the specified production method to produce the faces adjoining the receptacle slot, that is, the internal clamping faces on the gripping elements, exactly parallel to one another. Rather, by applying the ion beam to produce a receptacle slot, the receptacle slot is wider on the side facing toward the ion beam than on the side facing away from the ion beam. The clamping faces defining the slot which are thus generated are therefore not oriented parallel to one another. This finally results in an uneven distribution of clamping forces on the object to be held and has the danger that objects clamped between the clamping faces may shift in relation to the micro-gripper. Furthermore, the described method is only suitable in a limited way, and/or not at all for mass production, because exact fixing and positioning of the tungsten wire is required individually for each micro-gripper, before the processing using the ion beam may be performed, which makes the production method time-consuming and costly.

A production method of partially movable microstructures based on a dry-chemical etched sacrificial layer may be inferred from DE 195 22 004, the sacrificial layer, which typically comprises polyimide, being applied directly to a substrate layer, on which, completely spaced apart from the substrate layer by the sacrificial layer, a later partially movable micro-structured material layer is applied, for example, in further implementation as a cantilever with or without additional tip. For the purposes of the partial movement capability, the sacrificial layer located between the cantilever layer and the substrate layer is only partially removed in the course of a dry-chemical etching method, so that a residue of sacrificial layer remains in existence as a type of spacer.

SUMMARY OF THE INVENTION

Proceeding from the described prior art, it is the object of the present invention to specify a method for producing a micro-gripper as well as a micro-gripper, in which the disadvantages described above are avoided. The micro-gripper is particularly to be cost-effectively producible as a mass-produced product, have opposing clamping faces which are oriented parallel to one another on the gripping elements in the idle state, and be suitable for accommodating, transporting, and holding material samples in the context of their study in a TEM or SEM.

The invention specifies a method for producing a micro-gripper, which comprises a base body and a gripping body connected integrally to the base body, which projects beyond the base body and provides a receptacle slot on a free end area in such a way that a micrometer-scale or sub-micrometer-scale object may be clamped in the receptacle slot for gripping and holding. The method is essentially distinguished in that the base body and the gripping body are produced using a material deposition method with implementation of at least one shared first material layer and one shared second material layer, and the material layers are implemented as essentially flat and are bonded to one another. The invention further is a micro-gripper which is distinguished in that the base body and the gripping body are implemented as a uniform planar body, which is defined by two essentially flat overlapping planar body surfaces oriented parallel to one another.

Features advantageously of the invention may be inferred from the description, in particular with reference to the exemplary embodiments.

An essential concept of the invention is the production of a micro-gripper using a material deposition method with implementation of at least two flatly implemented material layers which are bonded to one another. Methods for depositing material are known in manifold forms to those skilled in the art. For the production according to the invention of a micro-gripper, methods from thin-film technology are especially suitable, by which the materials may be applied in thin layers, having layer thicknesses to below 1 μm, to a substrate. In particular, physical vapor deposition methods (PVD), that is, vapor deposition or sputtering, chemical vapor deposition methods (CVD), and methods derived therefrom, such as low-pressure CVD (LPCVD) or plasma-enhanced CVD (PECVD), or galvanic methods come into consideration for the deposition of the layers on the substrate. The layers thus deposited may be subsequently structured by masking or lithography methods having subsequent material abrasion by applying wet-chemical etching, reactive ion etching (RIE), sputter etching, ion beam etching, or plasma etching. Alternatively to the subsequent structuring of a layer already applied, the structuring of an applied layer may also be achieved by targeted local material deposition. Furthermore, by depositing a so-called sacrificial layer between two material layers and later removing the sacrificial layer, for example, by wet-etching methods, a nearly arbitrary three-dimensional structuring may be achieved on the material layers applied to the substrate. One skilled in the art is familiar with these technologies and their application.

If a method described or known in the context of thin-film technology is used for the production according to the invention of a micro-gripper, the production method for the micro-gripper comprises the following method steps in a simple case.

In a first method step, a flat substrate surface is provided. A silicon substrate is preferably suitable for this purpose because of its good surface planarity. In a second method step, a first sacrificial layer is applied to the substrate surface. In the third method step, the first material layer is applied to the first sacrificial layer. In the fourth method step, the application (and possibly the structuring) of the second sacrificial layer on the first material layer is performed, at least on a local area of the first material layer. The predominant part of the first material layer is typically not covered by the second sacrificial layer. The second sacrificial layer corresponds in its external dimensions in its application to the one local area to the receptacle slot to be produced on the gripping body, so that the receptacle slot is exposed after a removal of the second sacrificial layer in this area. In the fifth method step, the second material layer is applied to the second sacrificial layer and the areas of the first material layer not covered by the second sacrificial layer. In the simplest case, the first and the second material layers are bonded to one another directly with the exception of the one local area. In the sixth method step, the first and second sacrificial layers are removed. The removal of the second sacrificial layer implements the receptacle slot, the removal of the first sacrificial layer detaches the now completely produced micro-gripper from the substrate. Wet-chemical etching methods are suitable in particular for removing the sacrificial layers.

As a result of method steps 1-6, a micro-gripper is obtained, which is distinguished in that the base body and the gripping body of the micro-gripper are implemented as a uniform planar body, which is defined by two essentially flat planar body surfaces oriented parallel to one another and overlapping. The external free surfaces of the first and second material layers correspond to the planar body surfaces.

The receptacle slot on the gripping body preferably has two internal clamping faces situated parallel to one another, spaced apart from one another, and overlapping. The clamping faces preferably have a distance of 10 nm to 10 μm, in particular 50 nm to 1 μm to one another.

The lateral dimensioning of the planar body surfaces, and thus the lateral shaping of the base body, the gripping body, and finally also the clamping faces in the receptacle slot, are performed by a corresponding structuring of the layers arising in the context of the material deposition method described. As described above, the desired structuring of a layer may be performed by a local, that is, laterally appropriately defined deposition of the layer or by an appropriate lateral structuring of an already deposited layer. Corresponding structuring methods are known to those skilled in the art. By such a structuring of the layers, it is possible in particular to predefine the lateral dimensioning of the micro-gripper to be produced nearly arbitrarily and thus adapt the shape of the base body, the gripping body, and the clamping faces to the desired requirements.

By a corresponding structuring of the layers during the production method, micro-grippers, whose planar body surfaces completely overlap one another, are preferably produced. Furthermore, micro-grippers are preferably produced using the method according to the invention which are dimensioned and designed in such a way that they may accommodate and hold samples, which are to be studied using a TEM or SEM, for example, and which may be inserted directly into a commercially available sample retainer of a TEM or SEM. Micro-grippers in which the planar body surfaces correspond to a circular sector having a centerpoint angle $\alpha \leq 180°$ and the gripping body is situated projecting beyond a circular sector tip of the circular sector or whose planar body surfaces correspond to a circular segment having a centerpoint angle $\alpha \leq 180°$ and the gripping body is situated on the circular segment chord, in particular in the center of the circular segment chord, projecting beyond the circular segment, and the circular segment or the circular sector has a circle radius which is adapted to the radius of a sample retainer of a microscope, in particular an SEM or TEM, are particularly suitable for TEM/SCM applications of this type. For SEM or TEM, the radius of the sample retainer is typically 1.5 mm.

In addition, the planar body surfaces may correspond to a polygon, the gripping body being situated projecting beyond a peripheral edge of the polygon, or may have further arbitrary shapes.

The shape and relative position of the clamping faces on the receptacle slot is also determined by the structuring of the first and second material layers. The clamping faces preferably correspond to a polygon, in particular a rectangle or square, and completely overlap one another. For special applications, clamping faces which taper in the direction of the opening of the receptacle slot are also suitable in particular. Depending on the desired application, arbitrary further clamping face shapes are also possible by a corresponding structuring of the first and second material layers.

Several further advantageous embodiments are now to be specified for the production method described up to this point. Thus, the following materials may be used for the sacrificial layers: plastic, metal, or in particular silicon oxide. The following materials may be used for the material layers: plastics, ceramic, metal, semimetal, or in particular polysilicon. The use of the specified materials for the sacrificial layers or the material layers is not arbitrary, however. Appropriate material combinations which are suitable for described material deposition and sacrificial layer technologies are known to one skilled in the art. The pairing of sacrificial layers made of silicon oxide and material layers made of polysilicon has proven especially suitable.

However, the first and the second material layers may also comprise different materials and thus provide the micro-gripper according to the invention with special mechanical, electrical, magnetic, or chemical properties because of the different material properties of the first and the second material layers.

Furthermore, it may be advantageous for reasons of method technology to apply one or more intermediate layers to the substrate surface before the application of the first sacrificial layer to the substrate surface. For stabilization and protection, the possibility additionally exists of applying one or more stabilization or protective layers to the second material layer.

The simultaneous production of a plurality of micro-grippers on one or more planar substrates is possible in particular using the method according to the invention. Not only may manufacturing costs thus be reduced, but rather achievements of the object may also be implemented which, with high manufacturing precision, allow nearly arbitrary shaping of the flatly implemented micro-grippers, with shaping which is easy to change. The micro-grippers according to the invention are suitable in particular for accommodating, transporting, and holding material samples in the context of their study in a TEM or SEM.

BRIEF DESCRIPTION OF THE INVENTION

The invention is explained for exemplary purposes hereafter without restriction of the invention on the basis of exemplary embodiments with reference to the drawings. In the figures:

FIG. 1 shows an example of a micro-gripper;

FIGS. 2a, b show accommodation of an object using the micro-gripper;

FIGS. 3a, b show the layer buildup of a micro-gripper;

FIGS. 4a-g show method steps for producing a micro-gripper;

Figure 7A:
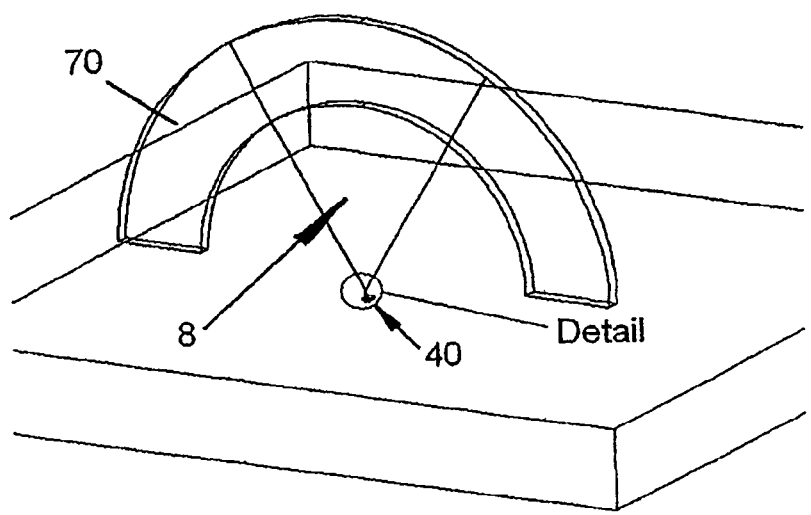

FIGS. 7a, b show a micro-gripper having base bodies designed in the shape of a circular sector; and FIG. 8 shows a micro-gripper having a base body designed in a semicircle.

DESCRIPTION OF THE PREFERRED EMBODIMENTS

Figure 1:
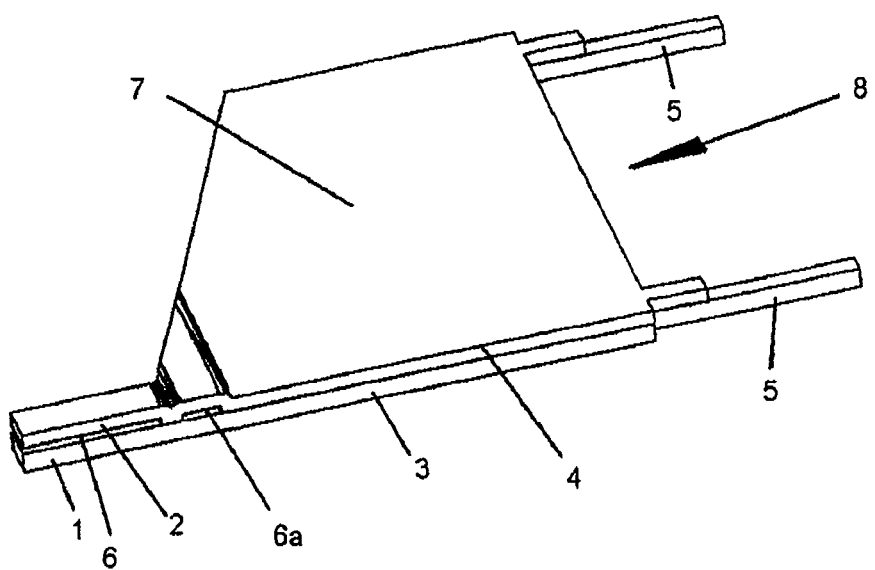

FIG. 1 shows a perspective view of a micro-gripper 8 produced according to the invention, which is implemented as a planar body. The planar body 8 comprises a first material layer 3 and a second material layer 4, which is bonded to the first material layer 3. The planar body 8 may be divided into a base body area having the associated planar body surface part 7 and a gripping body area having the gripping elements 1 and 2, between which the receptacle slot 6 is located. Furthermore, a continuous gap 6a running transversely to the gripping elements 1, 2 is provided in the connection area between base body and gripping body in the micro-gripper 8 shown. This gap is used for improved introduction of forces which arise by an elastic deformation of the gripping elements 1, 2 into the material layers 3 and 4. Thin webs 5 are provided on the right side of the micro-gripper 8 shown for fastening the micro-gripper on the substrate 9. The background for this is that during the etching process, in which the sacrificial layers are removed, the danger exists that the micro-gripper 8 may detach in an uncontrolled way from the substrate 9 and be lost. This is prevented by the thin webs 5, via which the micro-gripper still remains connected to the substrate after the etching of the sacrificial layers, as explained in greater detail hereafter.

The planar body surface 7 is used as an adapter face, for example, for receiving the micro-gripper in a handling system (transport manipulator), or for inserting it into the receptacle unit of an analysis device (SEM, TEM). In the present case, it has the form of a polygon. The planar body surface may, however, be dimensioned optimally in accordance with the specified requirements in the context of the production method.

Figure 2A:
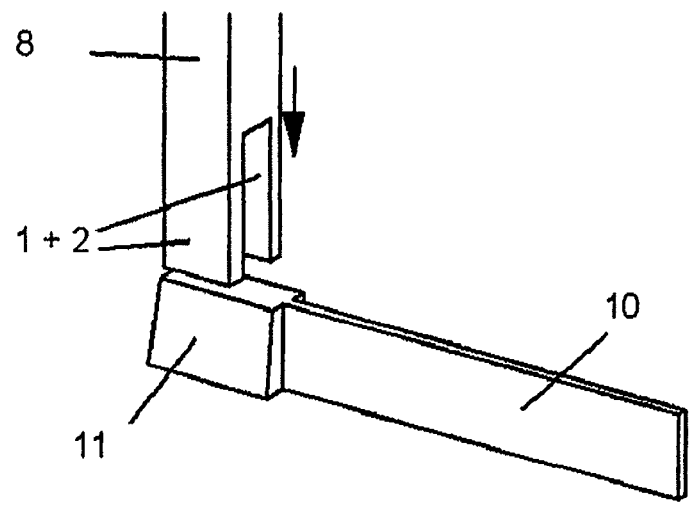
Figure 2B:
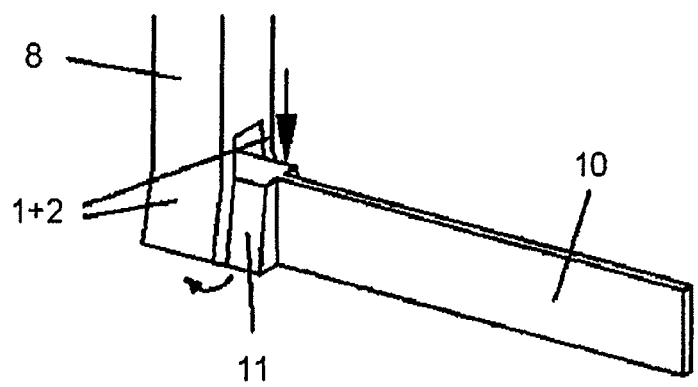

FIGS. 2a and 2b show the mode of operation of the micro-gripper 8. The gripping body area of the micro-gripper 8 having the gripping elements 1, 2 and the receptacle slot 6 lying between the gripping elements 1, 2, as well as a material sample 10 on which a bevel 11 is provided, are shown. To accommodate the material sample 10 using the micro-gripper 8, according to FIG. 2a, the micro-gripper 8 having the gripping elements 1, 2 is guided from above to the bevel 11 of the material sample 10. The bevel 11 is used for an optimum friction lock between the gripping elements 1, 2 and the material sample 10. Fundamentally, such a bevel is not necessary, however. FIG. 2b shows that the gripping elements 1, 2 are pushed over the bevel 11 of the material sample and thus spread apart. An elastic deformation of the gripping elements 1, 2 is caused by the spreading, which generates a retention force on the bevel by reaction. Because of this retention force and the friction forces acting between the clamping faces of the gripping elements 1, 2 and the bevel 11, holding of the material sample is achieved.

Figure 3A:
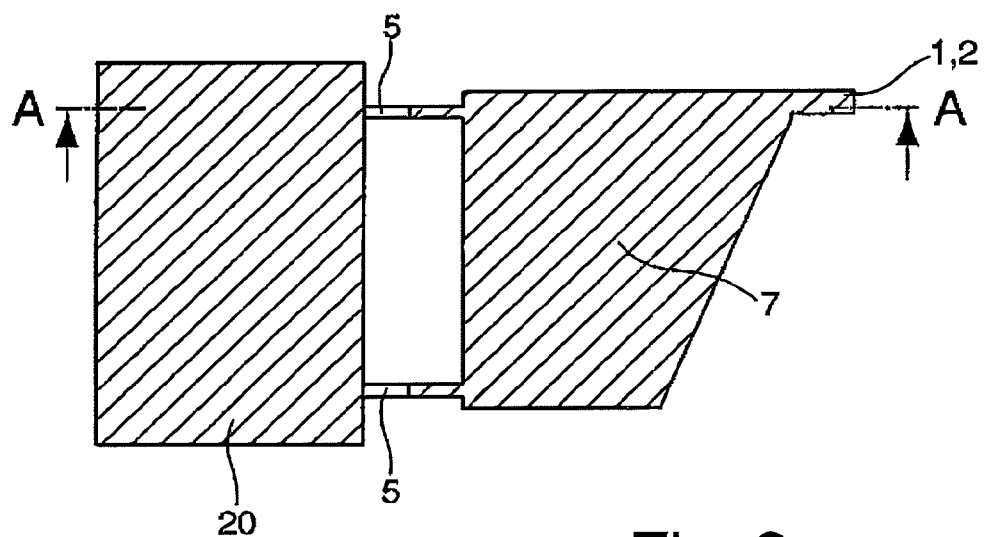
Figure 3B:
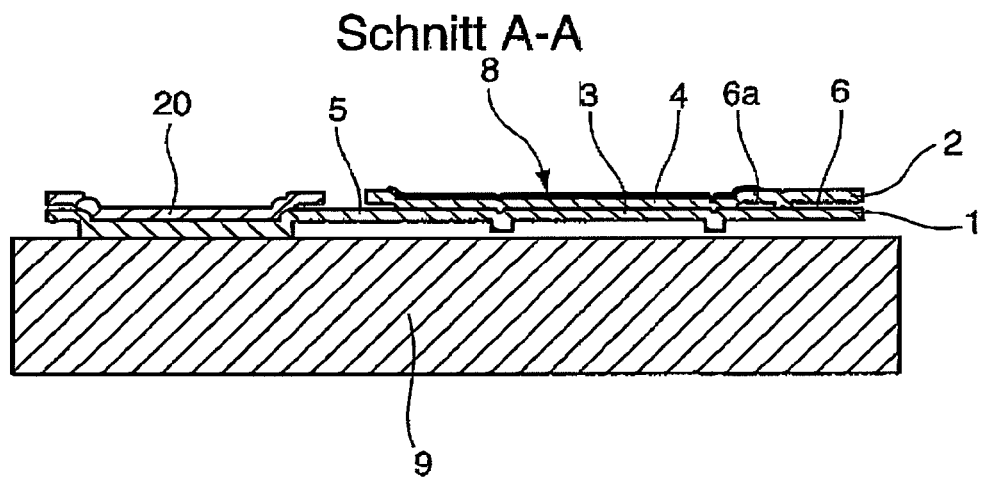

The micro-gripper from FIG. 1 is shown in the production phase after the sacrificial layers have been removed in FIGS. 3a and 3b. FIG. 3a first shows a view of the micro-gripper 8. The micro-gripper 8 is connected via the webs 5 to a retention area 20. Because the retention area 20 is connected fixed to the substrate 9 (not shown) even after the removal of the sacrificial layers, the micro-gripper 8 completely detached from the substrate 9 is still held by the retention area 20 via the webs 5. Unintended detachment or loss of the micro-gripper 8 after the removal of the sacrificial layers may thus be prevented. The webs 5 only have to be cut through to isolate the micro-gripper. The number, configuration, and cross-section (width and height) of the webs 5 are essentially directed according to the retention force, which is to be absorbed by the webs. FIG. 3b shows a section through the layer buildup along section line A-A'. It may be seen clearly that the substrate 9 is still connected fixed to the retention area 20 even after removal of the sacrificial layers. The micro-gripper 8 comprises the first material layer 3 and the second material layer 4, which are connected to one another. The removed sacrificial layers have exposed the receptacle slot 6 and the gap 6a. The micro-gripper 8 is connected to the retention area 20 via the webs 5, which are formed on the first material layer.

FIGS. 4a-4g explain the method for producing the micro-gripper shown in FIGS. 3a and 3b on the basis of the step-by-step layer buildup in a cross-sectional illustration along section line A-A' of FIG. 3a.

Figure 4A:
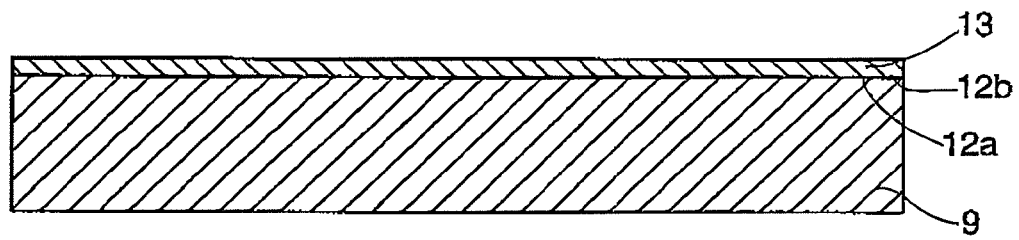

FIG. 4a In a first method step, an intermediate layer 12a and 12b is applied to a flat substrate 9 made of silicon. This intermediate layer 12a comprises silicon nitride and is used as an electrical insulator, the intermediate layer 12b comprises polysilicon and is used as a starting layer. A first sacrificial layer 13 made of silicon oxide is now deposited on this intermediate layer 12. The first sacrificial layer 13 is subsequently masked. This is performed by applying a photoresist layer or a similar mask. The masking shape may be worked out by exposure using an electron beam or using UV light, for example.

Figure 4B:
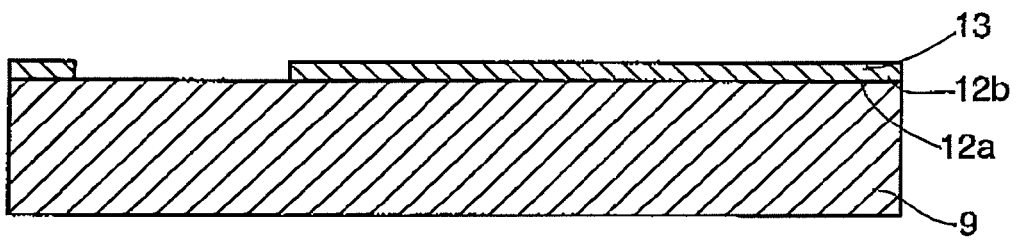

FIG. 4b After the masking has been finished, the first sacrificial layer 13 is removed at the exposed points using reactive ion etching (RIE). FIG. 4b shows that the sacrificial layer 13 is removed at least in the area on which the later retention area 20 is to be produced.

Figure 4C:
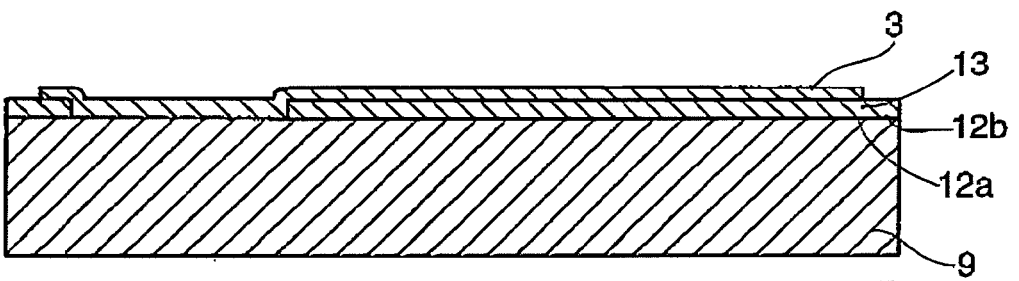

FIG. 4c The first material layer 3 made of polysilicon is then deposited on the first sacrificial layer 13. The first material layer 3 is also, as described above, provided with a mask in the desired form and etched by RIE, for example.

Figure 4D:
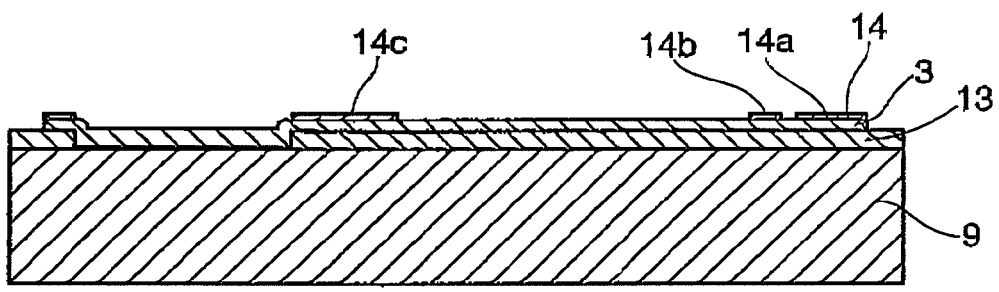

FIG. 4d A second sacrificial layer 14 is applied to the first material layer 3. This is also provided with a mask and etched in the desired form. The second sacrificial layer 14 remaining on the first material layer 3 corresponds in its geometric shapes 14a, 14b, 14c to the receptacle slot 6, the gap 6a, and the interruption of the second material layer 4 at the web 5 (compare FIG. 4e). If a larger cross-section of the web 5 is desired, the shape 14c may also be dispensed with.

Figure 4E:
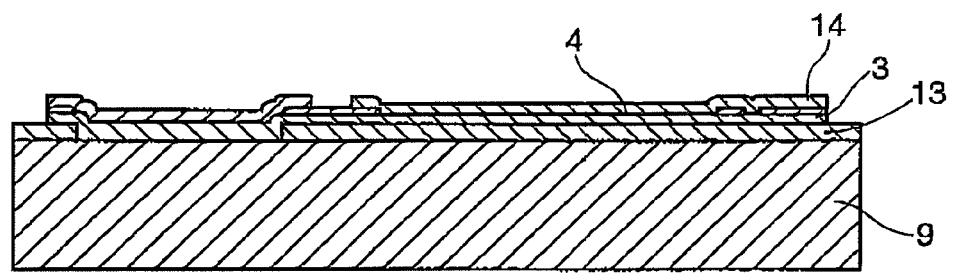

FIG. 4e The second material layer 4 made of polysilicon is deposited, masked, and correspondingly etched on the second sacrificial layer 14. As recognizable in FIG. 4e, the second material layer 4 is interrupted at the web 5 by the structuring of the second material layer 4. This is the case if an excessively large aspect ratio is expected, that is, the height of the web is greater than the width of the web. In the event of a desired larger cross-section of the web 5, the shape 14c is dispensed with, and the second material layer is applied directly to the web. In this case, the width of the web is not to be less than the height of the two layers, however.

Figure 4F:
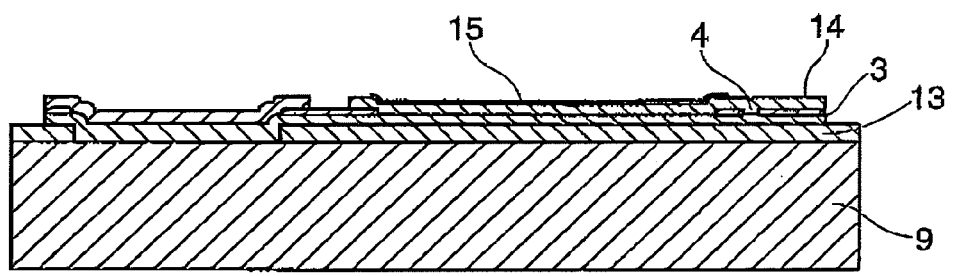

FIG. 4f A metal layer 15 is deposited on the second material layer 4 for stabilization. The metal layer 15 is also structured accordingly. This deposited metal layer 15 may also be used as a starting layer for further galvanic depositions. Instead of a metal layer 15, other materials, such as plastics or semimetals, may also be used for this purpose.

Figure 4G:
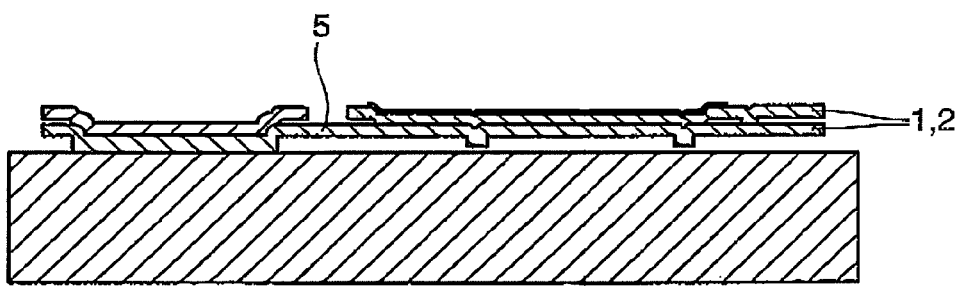

FIG. 4g The last method step for producing the micro-gripper 8 comprises removing the first and second sacrificial layers 13, 14 by an etching solution. The selection for removing the sacrificial layers 13, 14 is directed according to the material which the sacrificial layers 13, 14 comprise, of course.

The micro-grippers 8 produced according to the method according to FIGS. 4a-g may be used for accommodating and holding objects in the micrometer-range and sub-micrometer-range. A special application of the micro-gripper is the accommodation of electron-transparent samples for their subsequent study in a TEM or SEM. Samples of this type are prepared out of a material to be studied using the so-called focused ion beam technology (FIB technology) known to those skilled in the art.

Figure 5:
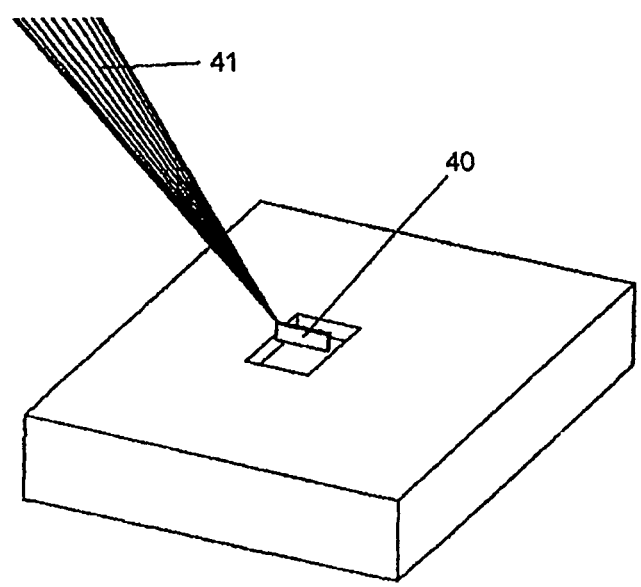
FIG. 5 shows isolation of a TEM sample from a substrate (prior art)

The typical methods for accommodating a TEM sample 40 of this type shown in FIG. 5 use a needle 41, which is fastened to the TEM sample 40 using material deposition. The micro-gripper 8 produced according to the invention, in contrast, allows an electron-transparent sample 40 produced using FIB technology to be accommodated using the gripping elements 1, 2 in an FIB preparation facility corresponding to FIGS. 2*a* and 2*b*.

Figure 6:
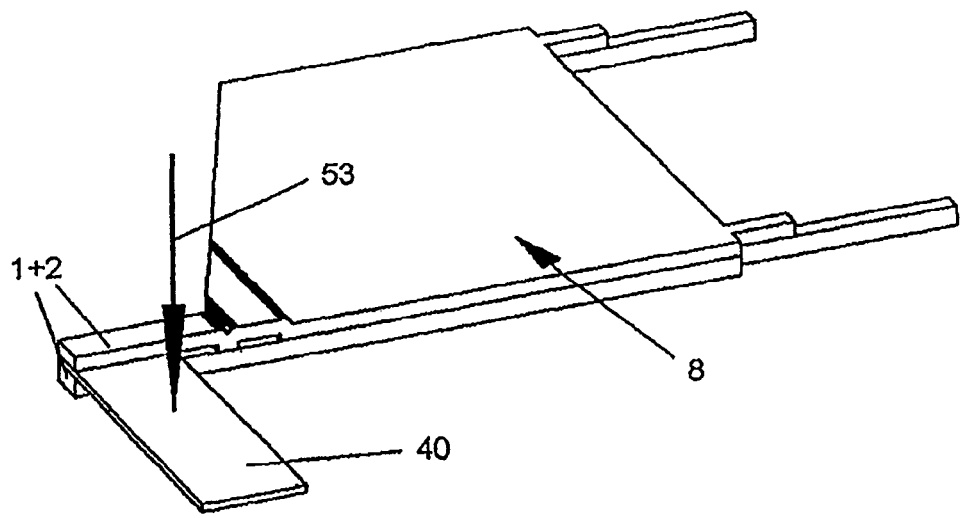
FIG. 6 shows a micro-gripper having TEM sample.

FIG. 6 shows the micro-gripper 8 and the TEM sample 40 clamped between the gripping elements 1, 2. The TEM sample 40 may be transferred directly into the TEM and is immediately available in the correct position for study using the electron beam 53. The essential advantage of this procedure is that the complicated so-called lift out process used up to this point is replaced by the one-time gripping of the TEM sample 40 by the micro-gripper. After the accommodation of the TEM sample 40, it may be studied together with the micro-gripper in the TEM. If necessary, after the TEM sample is accommodated by the micro-gripper, postprocessing of the TEM sample in the FIB preparation facility is possible.

Because the width of the receptacle slot 6 of the micro-gripper 8 may only be varied within a specific range, the TEM sample 40 is dimensioned using the FIB technology in such a way that the sample thickness required for holding is achieved on the later contact face to the micro-gripper 8. The remaining area of the TEM sample is prepared to the electron transparency required for the TEM study.

FIGS. 7*a* and 7*b* show a further advantageous embodiment of the micro-gripper 8 according to the invention. In this example, the micro-gripper 8 is used in connection with a half ring 70, which has an internal radius and an external radius. The micro-gripper 8 has a planar base body in the form of a circular sector, the gripping body having the TEM sample 40 being situated on the circular sector tip projecting beyond the circular sector. The radius of the circular sector of the base body shape is greater than the internal radius of the half ring 70. The external radius of the happening 70 and the radius of the circular sector of the base body are ideally equal. The micro-gripper 8 is accommodated with the aid of a device, such as a vacuum pipette, and fastened as shown to the half ring 70 using an adhesive. This half ring 70 may comprise different materials which are used in TEM analysis. The gripping elements 1, 2 project beyond the half ring, so that this configuration is suitable for accommodating TEM samples 40 from a substrate. FIG. 7*b* shows a detail enlargement of the acceptance of such a TEM sample 40 from an appropriately prepared substrate. Of course, micro-grippers having other shapes may also be fastened to the half ring 70. The external shape of the base body therefore does not necessarily have to be similar to a circular section.

FIG. 8 shows an embodiment of the micro-gripper 8 according to the invention in which the base body is implemented having a semicircular planar body surface 7. The radius R of this semicircle is dimensioned in such a way that the micro-gripper 8 may subsequently be directly transferred into the sample retainer of the TEM. The micro-gripper 8 is first held by a receptacle device 31 and the acceptance of the TEM sample 40 is thus performed. This configuration allows the direct transfer of the micro-gripper 8 into the sample retainer of the TEM, without an additional adaptation to a semicircular ring having to be performed. If circular sectors having centerpoint angles <180° are used instead of the semicircular shape, the retention of the micro-gripper in the sample retainer of the TE microscope proves difficult, because the micro-gripper may slip laterally and is thus not engaged correctly by the clamping nut of the sample carrier.

LIST OF REFERENCE NUMERALS

1, 2 gripping elements
3 first material layer
4 second material layer
5 web
6, 6*a* receptacle slot, gap
7 planar body surface in the area of the base body
8 micro-gripper, flat body
9 substrate
10 material sample
11 bevel
12 intermediate layer
13 first sacrificial layer
14, 14*a-c* second sacrificial layer
15 metal layer, stabilization layer
20 retention area
31 receptacle device
40 TEM sample
53 electron beam
70 half ring

The invention claimed is:

1. A method for producing a micro-gripper for clamping a micrometer-scale or sub-micrometer-scale object in a receptacle slot for gripping and holding between a first gripping element and a second gripping element, the method comprising the steps:

providing a flat substrate;
applying a first sacrificial layer over the flat substrate;
forming the first gripping element by applying at least one first material layer to the first sacrificial layer;
applying a second sacrificial layer to an area of the first material layer at least in an area where the receptacle slot is to be formed;
forming the second gripping element by applying a second material layer to the second sacrificial layer in the area where the slot is to be formed and forming a base body of the micro-gripper by applying the second material layer to an area of the first material layer to bond the first material layer to the second material layer;
removing the second sacrificial layer to provide the receptacle slot with free ends respectively comprising the first and second material layers with the receptacle slot being provided between the first material layer and the second material layer; and
removing an area of the first sacrificial layer to detach the micro-gripper from the flat substrate.

2. The method according to claim 1, further comprising:
applying the first sacrificial layer only to at least one surface area on the flat substrate or, after applying the first sacrificial layer on the flat substrate, structuring the first sacrificial layer.

3. The method according to claim 1, further comprising:
applying the first material layer to the first sacrificial layer only to at least one surface area of the first sacrificial layer or, after applying the first material layer to the first sacrificial layer, structuring the first material layer.

4. The method according to claim 1, further comprising:
structuring the second sacrificial layer after applying the second sacrificial layer to an area of the first material layer.

5. The method according to claim 1, further comprising:
applying the second material layer to at least one area of the second sacrificial layer and to the first material layer or structuring the second material layer after applying the second material layer to the at least one layer of the sacrificial layer and to the first material layer.

6. The method according to claim 1, further comprising:
applying at least one intermediate layer on the first substrate before applying the first sacrificial layer over the flat substrate.

7. The method according to claim 2, further comprising:
applying at least one intermediate layer on the first substrate before applying the first sacrificial layer over the flat substrate.

8. The method according to claim 3, further comprising:
applying at least one intermediate layer on the first substrate before applying the first sacrificial layer over the flat substrate.

9. The method according to claim 4, further comprising:
applying at least one intermediate layer on the first substrate before applying the first sacrificial layer over the flat substrate.

10. The method according to claim 5, further comprising:
applying at least one intermediate layer on the first substrate before applying the first sacrificial layer over the flat substrate.

11. The method according to claim 2, further comprising:
applying at least one stabilization layer to the second material layer.

12. The method according to claim 3, further comprising:
applying at least one stabilization layer to the second material layer.

13. The method according to claim 4, further comprising:
applying at least one stabilization layer to the second material layer.

14. The method according to claim 5, further comprising:
applying at least one stabilization layer to the second material layer.

15. The method according to claim 6, further comprising:
applying at least one stabilization layer to the second material layer.

16. The method according to claim 7, further comprising:
applying at least one stabilization layer to the second material layer.

17. The method according to claim 8, further comprising:
applying at least one stabilization layer to the second material layer.

18. The method according to claim 9, further comprising:
applying at least one stabilization layer to the second material layer.

19. The method according to claim 10, further comprising:
applying at least one stabilization layer to the second material layer.

20. The method according to claim 1, further comprising:
using plastic, ceramic, metal, or silicon oxide as the sacrificial layers.

21. The method according to claim 1, further comprising:
using plastic, ceramic, metal, semimetal, or polysilicon as the material layers.

22. The method according to claim 1, further comprising:
structuring the sacrificial layers and/or the first and/or second material layer by masking the layers and chemical etching, reactive ion etching (RIE), sputter etching, ion beam etching, or plasma etching masked layers.

23. The method according to claim 1, further comprising:
using CVD, LPCVD, PECVD, PVD, or galvanic deposition to provide material deposition.

24. The method according to claim 1, wherein:
the first and the second material layers are different materials.

25. The method according to claim 2, further comprising:
clamping the micrometer scale or the sub-micrometer scale object between the first material layer and the second material layer.

* * * * *

UNITED STATES PATENT AND TRADEMARK OFFICE
CERTIFICATE OF CORRECTION

PATENT NO. : 8,530,855 B2  Page 1 of 1
APPLICATION NO. : 12/301641
DATED : September 10, 2013
INVENTOR(S) : Grosse et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1259 days.

Signed and Sealed this
Fifteenth Day of September, 2015

Michelle K. Lee
*Director of the United States Patent and Trademark Office*